(12) United States Patent
Lim

(10) Patent No.: US 11,447,031 B2
(45) Date of Patent: Sep. 20, 2022

(54) ELECTRIC VEHICLE CHARGING APPARATUS

(71) Applicant: LG INNOTEK CO., LTD., Seoul (KR)

(72) Inventor: Myoung Keun Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 258 days.

(21) Appl. No.: 16/756,180

(22) PCT Filed: Oct. 17, 2018

(86) PCT No.: PCT/KR2018/012263
§ 371 (c)(1),
(2) Date: Apr. 15, 2020

(87) PCT Pub. No.: WO2019/078616
PCT Pub. Date: Apr. 25, 2019

(65) Prior Publication Data
US 2020/0276908 A1    Sep. 3, 2020

(30) Foreign Application Priority Data
Oct. 17, 2017 (KR) .................. 10-2017-0134514

(51) Int. Cl.
*B60L 53/66* (2019.01)
*H02J 7/00* (2006.01)
*G01R 19/165* (2006.01)
*G01R 31/327* (2006.01)
*B60L 53/14* (2019.01)

(52) U.S. Cl.
CPC ........ *B60L 53/66* (2019.02); *G01R 19/16528* (2013.01); *G01R 19/16542* (2013.01);
(Continued)

(58) Field of Classification Search
CPC ...... H02J 7/007; H02J 7/0047; H02J 7/00032; H02J 2207/20; G01R 19/16528;
(Continued)

(56) References Cited

U.S. PATENT DOCUMENTS

| | | | |
|---|---|---|---|
| 8,004,109 B2 * | 8/2011 | Komatsu | B60L 3/0046 307/115 |
| 2007/0115604 A1 * | 5/2007 | Zettel | H01H 47/002 361/160 |

(Continued)

FOREIGN PATENT DOCUMENTS

| | | |
|---|---|---|
| JP | 2012-170286 | 9/2012 |
| JP | 2016-101033 | 5/2016 |

(Continued)

OTHER PUBLICATIONS

International Search Report dated Mar. 29, 2019 issued in Application No. PCT/KR2018/012263.

*Primary Examiner* — Edward Tso
*Assistant Examiner* — Aaron Piggush
(74) *Attorney, Agent, or Firm* — Ked & Associates, LLP

(57) ABSTRACT

An electric vehicle charging controller according to an embodiment comprises: a first sensor for measuring a second voltage value between a first battery having a first voltage value and a relay in a high voltage line connected to electric vehicle charging equipment; a second sensor for measuring a third voltage value between the electric vehicle charging equipment and the relay in the high voltage line; and a control unit for controlling on/off of the relay, wherein if a difference between the second voltage value and the third voltage value is less than a preset fourth voltage value when the control unit applies a second battery voltage between the relay and the electric vehicle charging equipment in the high voltage line after controlling the relay to be turned off, the control unit determines that an operation of the relay is abnormal.

13 Claims, 5 Drawing Sheets

(52) U.S. Cl.
CPC .......... *G01R 31/3278* (2013.01); *H02J 7/007* (2013.01); *H02J 7/00032* (2020.01); *H02J 7/0047* (2013.01); *B60L 53/14* (2019.02); *H02J 2207/20* (2020.01)

(58) Field of Classification Search
CPC .......... G01R 31/3278; G01R 19/16542; B60L 53/66; B60L 53/14
USPC .......................... 320/104, 109, 157, 162, 163
See application file for complete search history.

(56) References Cited

U.S. PATENT DOCUMENTS

| | | | |
|---|---|---|---|
| 2010/0295506 A1* | 11/2010 | Ichikawa | B60L 50/61 320/108 |
| 2013/0127400 A1 | 5/2013 | Oh et al. | |
| 2013/0314012 A1* | 11/2013 | Cho | B60L 3/003 318/400.21 |
| 2014/0111120 A1* | 4/2014 | Mitsutani | B60L 15/00 318/139 |
| 2017/0225572 A1* | 8/2017 | Kawanaka | B60L 3/0069 |
| 2018/0123584 A1* | 5/2018 | Morimoto | B60L 3/0084 |
| 2020/0083732 A1* | 3/2020 | Kim | G01R 15/00 |

FOREIGN PATENT DOCUMENTS

| | | |
|---|---|---|
| JP | 2017-073888 | 4/2017 |
| KR | 10-2012-0012660 | 2/2012 |
| KR | 10-2017-0014666 | 2/2017 |

* cited by examiner

【FIG. 1A】
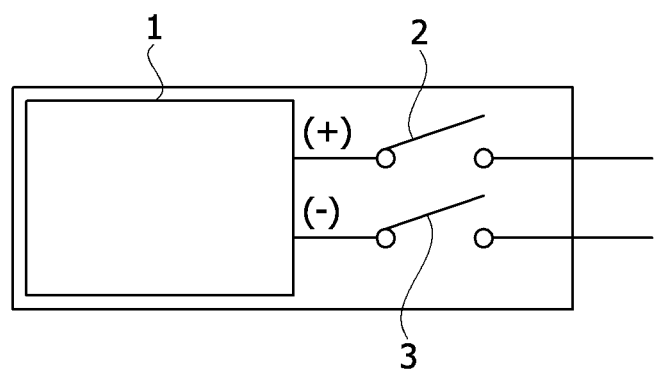
【FIG. 1B】
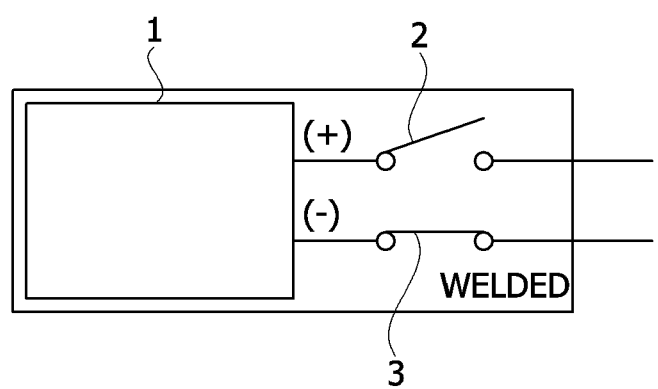

[FIG. 2]
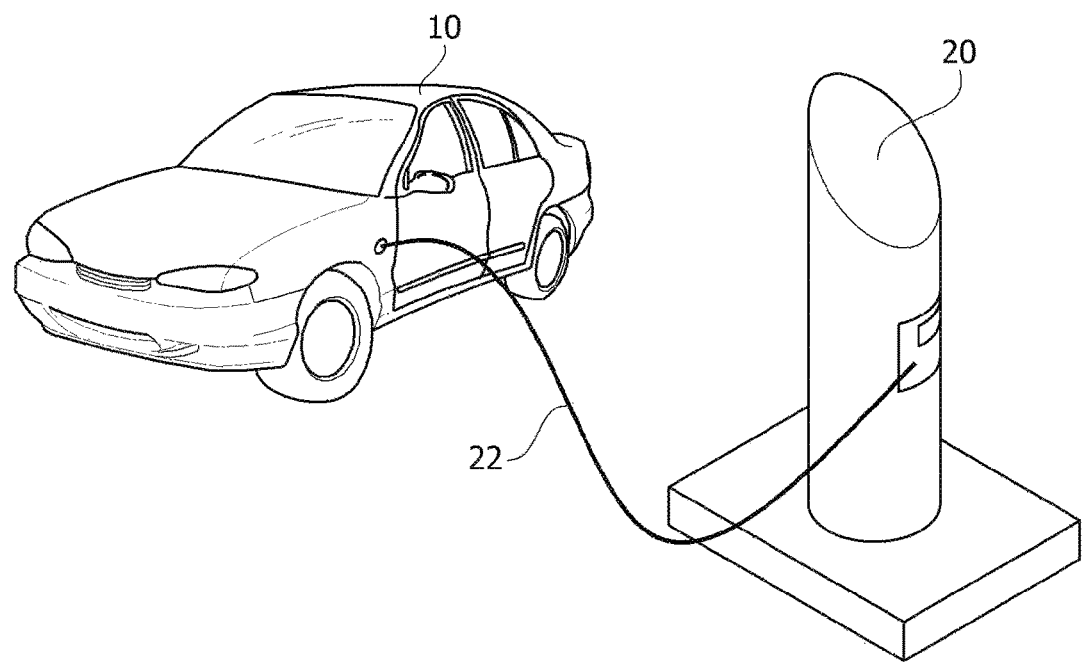
[FIG. 3]
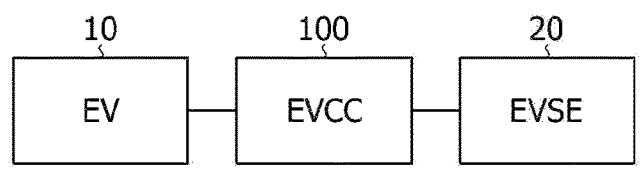

【FIG. 4】
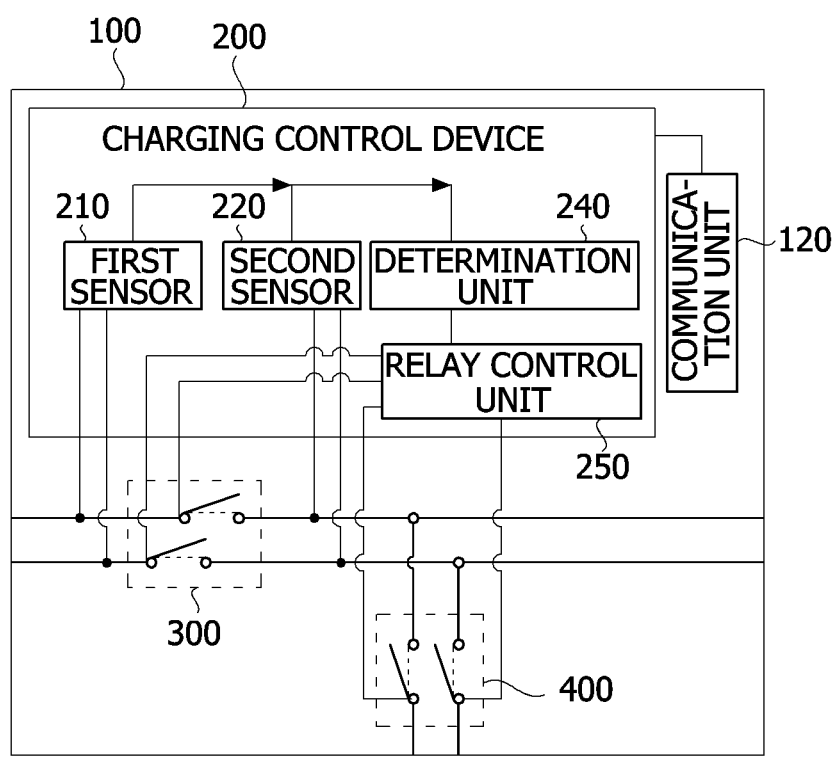

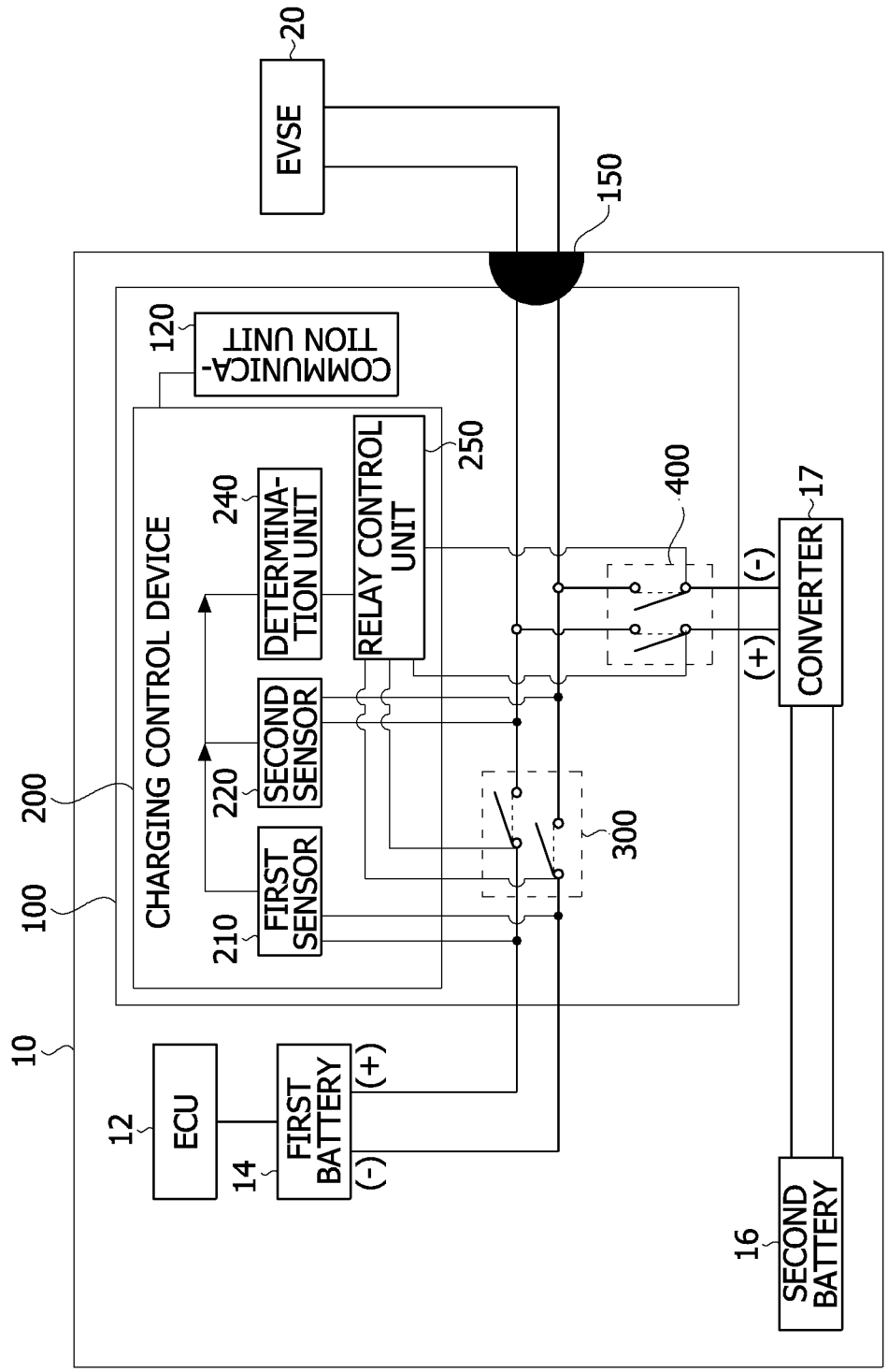
[FIG. 5]

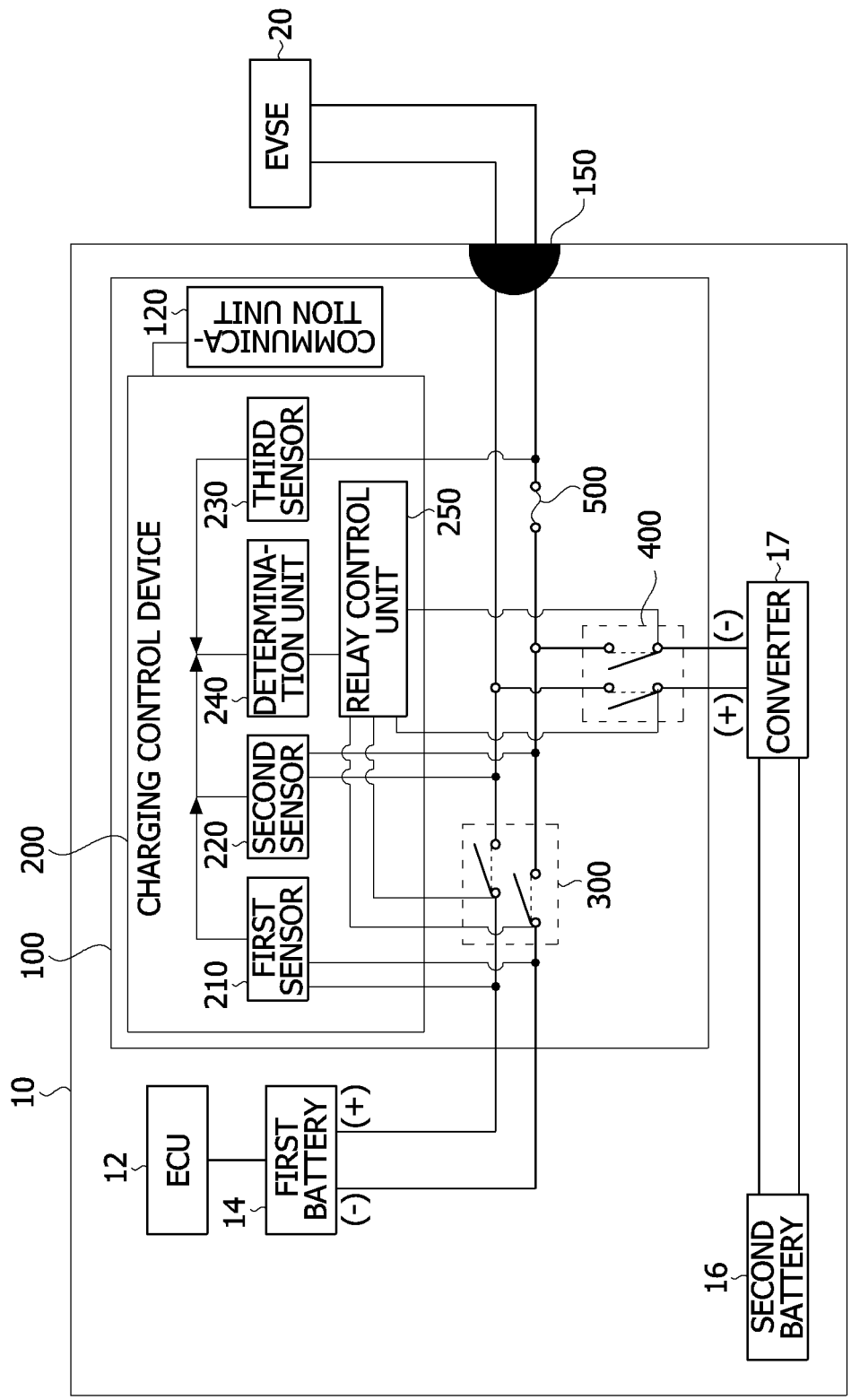

ELECTRIC VEHICLE CHARGING APPARATUS

CROSS-REFERENCE TO RELATED PATENT APPLICATIONS

This application is a U.S. National Stage Application under 35 U.S.C. § 371 of PCT Application No. PCT/KR2018/012263, filed Oct. 17, 2018, which claims priority to Korean Patent Application No. 10-2017-0134514, filed Oct. 17, 2017, whose entire disclosures are hereby incorporated by reference.

TECHNICAL FIELD

An embodiment relates to an electric vehicle charging controller.

BACKGROUND ART

Eco-friendly vehicles, such as electric vehicles (EVs) or plug-in hybrid electric vehicles (PHEVs), use electric vehicle supply equipment (EVSE) installed at supplies (charging stations) to charge batteries.

To this end, an electric vehicle charging controller (EVCC) is installed in the EV and communicates with the EV and the EVSE to control charging of the EV.

For example, when the EVCC receives a signal for instructing to start charging from the EV, the EVCC may control to start the charging, and when the EVCC receives a signal for instructing to finish charging from the EV, the EVCC may control to finish the charging.

Here, the EV may be charged through a slow charging method or fast charging method. When slow charging is performed, a charging time period of about seven hours is needed, and when fast charging is performed, a charging time period of about thirty minutes is needed.

Meanwhile, a current of an EV battery is interrupted by a relay, and when an overcurrent flows through the relay according to a load of the vehicle while charging the battery, a phenomenon may occur in which the relay is welded. When the relay is welded as described above, the battery may be over discharged, and in this case, the battery may be left in an over discharged state and thus a problem may occur in which the battery may no longer be used.

DISCLOSURE

Technical Problem

An embodiment is directed to providing an electric vehicle charging controller which allows welding of a relay to be easily diagnosed.

An embodiment is also directed to providing an electric vehicle charging controller which allows over-discharge of a battery to be prevented.

Objectives to be solved by embodiments are not limited to the above-described objectives and will include objectives and effectives which can be identified by solutions for the objectives and the embodiments described below.

Technical Solution

One aspect of the present invention provides an electric vehicle charging controller including a first sensor configured to measure a second voltage value between a first battery having a first voltage value and a relay in a high voltage line connected to electric vehicle supply equipment, a second sensor configured to measure a third voltage value between the electric vehicle supply equipment and the relay in the high voltage line, and a control unit configured to control turning the relay on or off, wherein if a difference between the second voltage value and the third voltage value is less than a preset fourth voltage value when the control unit applies a voltage of a second battery between the relay and the electric vehicle supply equipment in the high voltage line after controlling the relay to be turned off, the control unit determines that the relay is malfunctioning.

The malfunctioning of the relay may be a state in which the relay is welded.

The control unit may include a determination unit that determines whether the relay is malfunctioning.

When it is determined that the relay is malfunctioning, the control unit may transmit an off-signal to the relay again.

The electric vehicle charging controller may further include a converter disposed between the high voltage line and the second battery, and a switch disposed between the converter and the high voltage line, wherein a fixed fifth voltage value may be applied to the high voltage line through the converter.

The electric vehicle charging controller may further include a communication unit configured to communicate with an electronic control unit (ECU) of an electric vehicle, wherein the communication unit receives state information related to a charging state, a standby state, and a driving state of the electric vehicle from the ECU.

The relay control unit may transmit an off-signal to the switch when the electric vehicle is in the charging state, and the relay control unit may transmit an on-signal to the switch when the electric vehicle is in the standby state or the driving state.

The ECU may communicate with the electric vehicle supply equipment to transmit the state information related to the charging state, the standby state, and the driving state of the vehicle to the communication unit.

The fifth voltage value may set to a value in a range of ⅓ to ½ of the first voltage value.

The fourth voltage value may set to a value of ⅓ of the first voltage value.

The fifth voltage value may be set to a value of ½ of the first voltage value.

The fourth voltage value may be set to be equal to the fifth voltage value.

The electric vehicle charging controller may further include a fuse installed between the electric vehicle supply equipment and a contact to which the fifth voltage is applied in the high voltage line.

The electric vehicle charging controller may further include a third sensor configured to measure a sixth voltage value between the electric vehicle supply equipment and the fuse in the high voltage line, wherein when a difference between the third voltage value and the sixth voltage value is measured to be greater than or equal to a preset seventh voltage value, the diagnosis unit determines that the fuse is blown.

Advantageous Effects

According to embodiments, welding of a relay can be easily diagnosed by applying a low voltage (LV) for a vehicle to a high voltage line through which charging is performed.

Further, over-discharge of a battery can be prevented by interrupting a relay according to whether the relay is welded.

Various and useful advantages and effects of the present invention are not limited to the above-described advantages and may be more easily understood in the course of describing specific embodiments of the present invention.

DESCRIPTION OF DRAWINGS

FIGS. 1A and 1B are exemplary views illustrating a normal OFF operation and a welded state of an electric vehicle relay.

FIGS. 2 and 3 are exemplary views illustrating an electric vehicle charging system according to one embodiment of the present invention.

FIG. 4 is a block diagram illustrating an electric vehicle charging controller according to one embodiment of the present invention.

FIG. 5 is a block diagram illustrating the electric vehicle charging system to which the electric vehicle charging controller according to one embodiment of the present invention is applied.

FIG. 6 is a block diagram illustrating an electric vehicle charging system to which an electric vehicle charging controller according to another embodiment of the present invention is applied.

MODES OF THE INVENTION

Hereinafter, exemplary embodiments of the present invention will be described in detail with reference to the drawings.

However, the technical spirit of the present invention is not limited to some embodiments which will be described herein and may be implemented using various other embodiments, and at least one element of the embodiments may be selectively coupled, substituted, and used to implement the technical spirit within the range of the technical spirit.

Further, unless clearly and specifically defined otherwise by context, all terms (including technical and scientific terms) used herein can be interpreted as having customary meanings to those skilled in the art, and meanings of generally used terms, such as those defined in commonly used dictionaries, will be interpreted by considering contextual meanings of the related technology.

Further, the terms used in the embodiments of the present invention are provided only to describe embodiments of the present invention and not to limit the present invention.

In the present specification, the singular forms include the plural forms unless the context clearly indicates otherwise, and the phrase "at least one element (or one or more elements) of an element A, an element B, and an element C" should be understood as including the meaning of at least one of all combinations being obtained by combining the element A, the element B, and the element C.

Further, in describing elements of the embodiments of the present invention, the terms such as first, second, A, B, (a), (b), and the like may be used.

These terms are merely for distinguishing one element from other elements, and the essential, order, sequence, and the like of corresponding elements are not limited by the terms.

Also, when it is stated that one element is "connected," or "coupled" to another, the element may not only be directly connected or coupled to the other element but may also be connected or coupled to the other element with another intervening element.

Further, when an element is described as being formed or disposed "on (above)" or "under (below)" another element, the term "on (above)" or "under (below)" includes both of a case in which two elements are in direct contact with each other and a case in which one or more elements are (indirectly) disposed between two elements. In addition, when one element is described as being disposed "on or under" another element, such a description may include a case in which the one element is disposed at an upper side or a lower side with respect to another element.

Hereinafter, one embodiment of the present invention will be described in detail with reference to the accompanying drawings so that those skilled in the art may easily perform the present invention.

FIG. 1 is a set of exemplary views illustrating a normal OFF operation and a welded state of an electric vehicle relay.

First, when a more detailed description is given to welding of a relay, contacts of the relay include a fixed contact and a moving contact, and the state in which these two contacts are stuck together by an arc generated between the fixed contact and the moving contact and thus turning the relay on or off is not controlled is referred to as a malfunction of the relay, for example, a welded state of the relay.

In a vehicle in which two relays 2 and 3 are applied, when contact welding is generated in any one of the two relays, for example, when one relay 3 is welded, as shown in FIG. 1, the contact of the relay 3 in which the welding is generated is not released even in an ignition (IG)-off state in which both relays should be in an off state, and thus the relay 3 is not turned off.

When the relay control is impossible as described above, an inherent function/purpose of high voltage may not be achieved, and a secondary accident such as an electric shock, a fire, or the like is inevitably generated as well as a primary accident due to the inability to secure insulation during an accident such as a collision.

For example, when the off-control of the relays 2 and 3 is impossible due to the contact welding in the IG-off state, a high voltage direct current (DC) component is exposed to the outside, which may result in a dangerous situation such as an electric shock, and when power of a high voltage battery 1 is exposed to the outside, an electric closed loop is formed through the high voltage battery and a human body so that current runs therethrough, and thus the human body is exposed to various types of electric shock risks.

In other words, the human body may lead to an electric shock risk in a direct contact state in which the human body comes into contact with high voltage positive (+) and negative (−) terminals at the same time, an electric shock risk in a direct/indirect contact state in which the human body comes into contact with any one terminal under a condition in which insulation between a vehicle body and wires is broken or comes into contact with the terminal and a high voltage part, in which insulation is broken, at the same time, or an electric shock risk in an indirect contact state in which the human body comes into contact with the high voltage part in which insulation is broken under the condition in which the insulation between the vehicle body and the wires is broken or comes into contact with two high voltage parts, in which insulation is broken, at the same time.

FIGS. 2 and 3 are exemplary views illustrating an electric vehicle charging system according to one embodiment of the present invention.

Referring to FIGS. 2 and 3, an electric vehicle (EV) 10 may be charged from an electric vehicle supply equipment (EVSE) 20. To this end, a charging cable 22 connected to the EVSE 20 may be connected to an inlet of the EV 10. Here, the EVSE 20 is equipment that supplies an alternating current (AC) or DC, and may be disposed at a supply or home, or may also be portably implemented. The EVSE 20 may also be referred to as a supply, an AC supply, a DC supply, a socket-outlet, or the like.

An electric vehicle charging controller (EVCC) 100 is installed in and connected to the EV 10. For example, the EVCC 100 may be installed in a trunk of the EV 10, but the present invention is not limited thereto.

The EV 10 may be charged in a supply in which the EVSE 20 is disposed. To this end, the charging cable 22 connected to the EVSE 20 may be connected to an inlet 150 of the EV 10.

A charging mode of the EV 10 may be classified into several types according to a connection method between the EVSE 20 and the EV 10. For example, the charging mode may be classified into Mode 1 in which the EV 10 is connected to an AC supply network using a standardized socket-outlet, Mode 2 in which the EV 10 is connected to the AC supply network using a control pilot (CP) function and a protection system against electric shock between the EV 10 and a plug or a part of an in-cable control box, Mode 3 in which the EV 10 is permanently connected to the AC supply network using a dedicated EVSE, in which the CP function extends to control equipment in the EVSE, and Mode 4 in which the EV 10 is connected to the supply network using a DC EV charging station (e.g., off-board charger) in which the CP function extends to a DC EV charging station.

According to one embodiment of the present invention, a malfunction of a relay, for example, welding of the relay, in the EVCC of the EV is diagnosed in states other than a charging state, and when the welding is diagnosed, the relay is quickly turned off.

FIG. 4 is a block diagram illustrating an electric vehicle charging controller according to one embodiment of the present invention.

Referring to FIGS. 2 to 4, an electric vehicle charging controller 100 according to one embodiment of the present invention includes a communication unit 120, a charging control device 200, a relay 300, and a switch 400.

The communication unit 120 may transmit and receive signals between the EVSE 20, the charging control device 200, and an electric power control unit (ECU) of the EV 10 and receive signals for controlling charging of a first battery 14 from the ECU. In addition, the communication unit 120 may also transfer control signals of the charging control device 200.

Such a communication unit 120 may have a plurality of communication channels, and the plurality of communication channels may operate under different protocols. For example, one communication channel may operate under a protocol that supports power line communication (PLC), pulse width modulation (PWM), or both thereof, and another communication channel may operate under a protocol that supports a controller area network (CAN).

The charging control device 200 is connected to each of the EV 10 and the EVSE 20. The charging control device 200 may be connected to each of the EV 10 and the EVSE 20 through a plurality of pins.

For example, the charging control device 200 may include 20 pins connected to the EVSE 20 and communicate with the EVSE 20 through the 20 pins. For example, among the 20 pins, one pin may be a pin for a CP port for receiving a CP signal from the EVSE 20, another pin may be a pin for a proximity detection (PD) port for detecting whether a charging cable connector is close, and still another pin may be a pin for a protective earth (PE) port connected to the ground of the EVSE 20. Yet another pin among the 20 pins may be a pin for driving a motor to open a flap of a charge port, still yet another pin thereof may be a pin for sensing a motor, still yet another pin thereof may be a pin for sensing a temperature, still yet another pin thereof may be a pin for sensing a light-emitting diode (LED), and still yet another pin thereof may be a pin for CAN communication. However, the number and functions of the pins are not limited thereto and may be variously changed.

In addition, the charging control device 200 includes twelve pins connected to the EV 10 and may communicate with the EV 10 through the twelve pins. For example, among the twelve pins, one pin may be a pin for a line of a voltage applied from a collision detection sensor in the EV 10, another pin may be a battery pin in the EV 10, still another pin may be a pin for CAN communication, yet another pin may be a pin connected to the ground, and still yet another pin may be a high voltage protection pin. However, the number and functions of the pins are not limited thereto and may be variously changed.

Two high voltage lines of the EVSE 20 supply power to the first battery of the EV 10 through the relay 300 of the charging apparatus 100, and here, turning the high voltage lines on or off may be controlled by the charging control device 200.

That is, the charging control device 200 may communicate with the ECU of the EV 10 through the communication unit 120 and control the relay 300 configured to transfer the power supplied from the EVSE 20 to the first battery of the EV 10 according to the signals received from each of the EV 10 and the EVSE 20.

Here, the charging control device 200 may include a first sensor 210, a second sensor 220, and a control unit, and the control unit may include a determination unit 240 and a relay control unit 250. In the present specification, the determination unit 240 may also be referred to as a diagnosis unit.

The first sensor 210 measures a voltage of a first point at a front end of the relay 300 in a high voltage line connecting the first battery to the inlet to be connected to the EVSE 20. That is, the first sensor 210 may measure a value (level) of a second voltage applied to the front end of the relay 300.

Here, the front end of the relay 300 may be defined as a point between the first battery and the relay 300 of the EV 10.

The second sensor 220 measures a voltage of a second point at a rear end of the relay 300 in the high voltage line. That is, the second sensor 220 may measure a value (level) of a third voltage applied to the rear end of the relay 300.

Here, the rear end of the relay 300 may be defined as a point between the relay 300 and the charge port of the EV 10.

The control unit included in the charging control device 200 according to one embodiment of the present invention controls turning the relay 300 on or off and determines the malfunction of the relay using the value of the voltage measured at each point of the high voltage line after controlling the relay 300 to be turned off.

That is, the control unit controls the relay 300 to be turned off, and then compares/analyzes the value of the voltage measured at each point of the high voltage line through the first sensor 210 and the second sensor 220 to determine whether the relay 300 is malfunctioning, that is, whether the relay 300 is welded, and transmits an off-operation signal to the relay 300 again when it is determined that the relay 300 is malfunctioning. Here, the determination unit 240 may determine whether the relay 300 is malfunctioning, and the relay control unit 250 may transmit the off-operation signal to the relay 300.

The determination unit 240 diagnoses whether the relay 300 is malfunctioning, that is, whether the relay 300 is welded in states of the EV 10 other than a charging state among the charging state, a standby state, and a driving state of the EV 10 received through the communication unit 120, and when the EV 10 is in the charging state, the determination unit 240 is switched to a sleep mode.

More specifically, the control unit controls the relay 300 to be turned off, and then compares the difference between the voltage values of the front end and the rear end of the relay 300 obtained through the first sensor 210 and the second sensor 220 with a preset fourth voltage value to determine whether the relay 300 is malfunctioning, that is, whether the relay 300 is welded.

For example, when a voltage of a second battery is applied to the high voltage line between the relay 300 and the EVSE 20 in a state in which the relay 300 is controlled to be turned off, the determination unit 240 determines that the relay 300 is normal when the difference between the second voltage value measured by the first sensor 210 and the third voltage value measured by the second sensor 220 is greater than or equal to the preset fourth voltage, and on the contrary, determines that the relay 300 is malfunctioning, that is, the relay 300 is welded, when the difference between the second voltage value and the third voltage value is less than the fourth voltage.

The switch 400 interrupts the connection between the high voltage line and a converter that is configured to fix and output the voltage of the second battery of the EV 10 and may be integrally formed with the converter and may be implemented as an internal configuration of the charging control device 200. FIG. 5 is a block diagram illustrating the electric vehicle charging system to which the electric vehicle charging controller according to one embodiment of the present invention is applied.

Hereinafter, the operation of the charging control device 200 of the electric vehicle charging controller 100 will be described through the electric vehicle charging system to which the electric vehicle charging controller according to one embodiment of the present invention is applied.

Referring to FIG. 5, the EV 10 includes an ECU 12, the first battery 14, a second battery 16, a converter 17, and the above-described electric vehicle charging controller 100.

The ECU 12 allows various parts such as an engine, an automatic transmission, an anti-lock braking system (ABS), and the like of the vehicle to be controlled by a computer and may be connected to and communicate with the charging apparatus 100 and/or the EVSE 20.

In particular, the ECU 12 may communicate with the EVSE 20 to transmit and receive the states of the electric vehicle, that is, the charging state, the standby state, or the driving state.

The first battery 14 is a high voltage battery that supplies a driving voltage to a driving unit of the vehicle, such as a motor (not shown), through an inverter (not shown). Such a first battery 14 may be charged through the EVSE 20 and the charging apparatus 100 and may also be charged through regenerative energy and/or engine operation of the vehicle. For example, the first battery 14 may have a first voltage capacity. However, when an abnormality in at least one of a plurality of battery cells constituting the first battery 14 is sensed by a battery management system (BMS) of the first battery 14, the first battery 14 may interrupt a circuit, and thus a voltage output from the first battery 14 may be 0 V.

The second battery 16 supplies a driving voltage to an electrical load such as a sensor, a microcontroller (MCU), a relay, and the like of the vehicle and may be generally composed of a low-voltage battery of approximately DC 12 V to 24 V.

Such a second battery 16 may constantly apply a converted voltage to the charging apparatus 100 through the converter 17. For example, the second battery 16 may apply a fifth voltage to the charging apparatus 100 through the converter 17.

The converter 17 is composed of either an insulated gate bipolar transistor (IGBT) or a field-effect transistor (FET), which is a power semiconductor switching element, and is switched according to the control signal applied from the charging apparatus 100 to perform DC/DC converting in which a voltage is increased or decreased.

Such a converter 17 may be connected to the high voltage line through the switch 400, and the switch 400 may be switched according to the control signal of the charging apparatus 100.

Here, when the power is not supplied from the EVSE 20 and the relay 300 is normally turned off, the second voltage value measured by the first sensor 210 is similar or identical to the voltage applied to the high voltage line from the first battery 14, and the third voltage value measured through the second sensor 220 is similar or identical to the voltage applied to the high voltage line from the second battery 16 through the converter 17.

For example, the voltage applied to the high voltage line from the first battery 14 may be set to 0 V or 60 V, and the voltage applied to the high voltage line through the converter 17 from the second battery 16 may be set to 24 V. In addition, the fourth voltage value may be set to a value in a range of ⅓ (20 V) to ½ (30 V) of the first voltage (60 V) that is the voltage of the first battery 14. For example, as an example, the fourth voltage value may be set to 20 V. However, the setting of such a voltage value is merely described by way of example for the convenience of description and may be appropriately changed according to various embodiments, and the present invention is not specifically limited thereto.

That is, when the control unit controls the relay 300 to be turned off, if the relay 300 is normally turned off, the difference between the second voltage value and the third voltage value may be measured as 24 V to 36 V, which is greater than 20 V that is the set fourth voltage value, and thus the relay 300 may be diagnosed as being normally turned off regardless of whether the first battery 14 is in a normal state (60 V) or a defective state (0 V).

However, when the control unit controls the relay 300 to be turned off, if the relay 300 is not normally turned off due to the welding of the relay 300, a point at which the voltage is measured by the first sensor 210 is electrically connected to a point at which the voltage is measured by the second sensor 220 so that the difference between the second voltage value and the third voltage value may be measured as a value within 5 V, which is less than 20 V that is the set fourth voltage value, and thus the relay 300 may be diagnosed as being welded regardless of whether the first battery 14 is in a normal state (60 V) or a defective state (0 V).

Here, when the phenomenon of resistance or voltage fluctuation is ignored, it is easy for the calculation and the diagnosis that a fifth voltage value and the fourth voltage value are set to a value of ½ (30 V) of the first voltage (60 V) that is the voltage of the first battery 14.

That is, when the control unit controls the relay 300 to be turned off, if the relay 300 is normally turned off, the difference between the second voltage value and the third voltage value may be measured as 30 V, which is greater than or equal to 30 V that is the set fourth voltage value, and thus the relay 300 may be diagnosed as being normally turned off regardless of whether the first battery 14 is in a normal state (60 V) or a defective state (0 V).

However, when the control unit controls the relay 300 to be turned off, if the relay 300 is not normally turned off due to the welding of the relay 300, a point at which the voltage is measured by the first sensor 210 is electrically connected to a point at which the voltage is measured by the second sensor 220 so that the difference between the second voltage value and the third voltage value may be measured as a value within 5 V, which is less than 30 V that is the set fourth voltage value, and thus the relay 300 may be determined as being welded regardless of whether the first battery 14 is in a normal state (60 V) or a defective state (0 V).

Meanwhile, when the determination unit 240 determines that the relay 300 is malfunctioning, that is, is welded, the determination unit 240 may transmit and hold a relay-off signal to the relay 300 through the relay control unit 250 so that the remaining one relay 300 is turned off and transmit a message regarding whether the relay 300 is welded to a user through the communication unit 120.

Meanwhile, as described above, when the EV 10 is in the charging state, the determination unit 240 is switched to the sleep mode and does not determine whether the relay 300 is welded and thus turns off the switch 400 through the relay control unit 250 so that the voltage supplied from the second battery 16 may not be applied to the high voltage line.

FIG. 6 is a block diagram illustrating an electric vehicle charging system to which an electric vehicle charging controller according to another embodiment of the present invention is applied.

Hereinafter, the operation of a charging control device 200 of an electric vehicle charging controller 100 will be described through the electric vehicle charging system to which the electric vehicle charging controller according to another embodiment of the present invention is applied.

Here, in the electric vehicle charging system of FIG. 6, the same reference numerals are used for the same configuration as the electric vehicle charging system of FIG. 5, and thus a repetitive description thereof will be omitted below.

Referring to FIG. 6, in the electric vehicle charging system according to another embodiment of the present invention, the electric vehicle charging controller 100 further includes a third sensor 230 and a fuse 500.

The fuse 500 is disposed at a rear end of a contact to which a third voltage is applied through a switch 400 in a high voltage line.

Further, the third sensor 230 measures a voltage at a point between the fuse 500 and an inlet 150 in the high voltage line. That is, the third sensor 230 may measure a value (level) of a sixth voltage applied to a point after the fuse 500 at a rear end of a relay 300. Meanwhile, a determination unit 240 compares the difference between voltage values of a front end and a rear end of the fuse 500 obtained through a second sensor 220 and the third sensor 230 with a preset seventh voltage to determine whether the fuse 500 is blown.

For example, when the difference between a third voltage value and the sixth voltage value is less than or equal to the seventh voltage, the determination unit 240 determines that the fuse 500 is normal, and on the contrary, when the difference between the third voltage value and the sixth voltage value is greater than the seventh voltage, the determination unit 240 determines that the fuse 500 is blown.

Here, when power is not supplied from the EVSE 20, the relay 300 is normally turned off, and the fuse 500 is normal, the third voltage value measured through the second sensor 220 is similar or identical to the voltage applied to the high voltage line from the second battery 16 through the converter 17, and the sixth voltage value measured through the third sensor 230 may have a predetermined difference of approximately 5 V or less from the third voltage value.

For example, like in the above-described embodiment, the voltage applied to the high voltage line from the second battery 16 through the converter 17 may be set to 24 V. In addition, the seventh voltage may be set to 5 V that is a predetermined voltage difference due to the fuse 500. However, the setting of such a voltage value is merely described by way of example for the convenience of description and may be appropriately changed according to the performance of the fuse 500, and the present invention is not specifically limited thereto.

That is, when the fuse 500 is normal, the difference between the third voltage value and the sixth voltage value may be measured as a value within 5 V, which is within a range of the set seventh voltage value, and thus the fuse 500 may be determined to be normal.

However, when the fuse 500 is blown, the point at which the voltage is measured by the second sensor 220 is electrically blocked from the point at which the voltage is measured by the third sensor 230 so that the difference between the third voltage value and the sixth voltage value has a great difference value exceeding 5 V, which is less than 5 V that is the set seventh voltage value and thus the fuse 500 is determined to be blown.

Meanwhile, when it is determined that the fuse 500 is blown, the determination unit 240 holds a relay-off signal transmitted to the relay 300 using a relay control unit 250 and transmits a message regarding whether the fuse 500 is blown to the user through a communication unit 120.

The relay control unit 250 controls the operation of each of the relay 300 and the switch 400 that is connected to the converter 17 and controls turning each of the relay 300 and the switch 400 on or off according to the determination of the determination unit 240.

While the embodiments have been mainly described, the embodiments are only examples but do not limit the present invention, and it may be known to those skilled in the art that various modifications and applications, which have not been described above, may be made without departing from the essential properties of the embodiments. For example, each component specified in the embodiments may be modified and implemented. In addition, it is to be understood that differences related to such modifications and applications fall within the scope of the present invention defined in the appended claims.

The invention claimed is:

1. An electric vehicle charging controller comprising:
a first sensor configured to measure a second voltage value between a first battery having a first voltage value and a relay in a high voltage line connected to electric vehicle supply equipment;
a second sensor configured to measure a third voltage value between the electric vehicle supply equipment and the relay in the high voltage line; and
a control unit configured to control turning the relay on and to control turning the relay off,
wherein if a difference between the second voltage value and the third voltage value is less than a preset fourth voltage value when the control unit applies a voltage of a second battery in the high voltage line between the relay and the electric vehicle supply equipment after controlling the relay to be turned off, the control unit determines that the relay is malfunctioning, the electric vehicle charging controller further comprising:
a converter disposed between the high voltage line and the second battery; and
a switch disposed between the converter and the high voltage line,
wherein a fixed fifth voltage value is applied to the high voltage line through the converter.

2. The electric vehicle charging controller of claim 1, wherein the malfunctioning of the relay is a state in which the relay is welded.

3. The electric vehicle charging controller of claim 1, wherein the control unit includes a determination unit that determines whether the relay is malfunctioning.

4. The electric vehicle charging controller of claim 1, wherein, when the relay is determined to be malfunctioning, the control unit transmits an off-signal to the relay again.

5. The electric vehicle charging controller of claim 1, further comprising a communication unit configured to communicate with an electronic control unit (ECU) of an electric vehicle, wherein the communication unit receives state information related to a charging state, a standby state, and a driving state of the electric vehicle from the ECU.

6. The electric vehicle charging controller of claim 5, wherein
the control unit transmits an off-signal to the switch when the electric vehicle is in the charging state, and
the control unit transmits an on-signal to the switch when the electric vehicle is in the standby state or the driving state.

7. The electric vehicle charging controller of claim 5, wherein the ECU communicates with the electric vehicle supply equipment to transmit the state information related to the charging state, the standby state, and the driving state of the electric vehicle to the communication unit.

8. The electric vehicle charging controller of claim 1, wherein the fixed fifth voltage value is set to a value in a range of ⅓ to ½ of the first voltage value.

9. The electric vehicle charging controller of claim 8, wherein the fourth voltage value is set to a value of ⅓ of the first voltage value.

10. The electric vehicle charging controller of claim 1, wherein the fixed fifth voltage value is set to a value of ½ of the first voltage value.

11. The electric vehicle charging controller of claim 10, wherein the fourth voltage value is set to be equal to the fixed fifth voltage value.

12. The electric vehicle charging controller of claim 1, further comprising a fuse installed between the electric vehicle supply equipment and a contact to which a voltage having the fixed fifth voltage value is applied in the high voltage line.

13. The electric vehicle charging controller of claim 12, further comprising a third sensor configured to measure a sixth voltage value between the electric vehicle supply equipment and the fuse in the high voltage line, wherein when a difference between the third voltage value and the sixth voltage value is measured to be greater than or equal to a preset seventh voltage value, the control unit determines that the fuse is blown.

* * * * *